US012067237B2

United States Patent
Viswanathan et al.

(10) Patent No.: US 12,067,237 B2
(45) Date of Patent: Aug. 20, 2024

(54) FLEXIBLE MEMORY SYSTEM

(71) Applicant: Advanced Micro Devices, Inc., Santa Clara, CA (US)

(72) Inventors: Vidyashankar Viswanathan, Boxborough, MA (US); Richard E. George, Santa Clara, CA (US); Michael Y. Chow, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 16 days.

(21) Appl. No.: 17/565,315

(22) Filed: Dec. 29, 2021

(65) Prior Publication Data

US 2023/0205420 A1 Jun. 29, 2023

(51) Int. Cl.
*G06F 3/06* (2006.01)
(52) U.S. Cl.
CPC ............ *G06F 3/061* (2013.01); *G06F 3/0644* (2013.01); *G06F 3/0676* (2013.01); *G06F 3/0677* (2013.01); *G06F 3/0679* (2013.01)
(58) Field of Classification Search
CPC ...... G06F 3/061; G06F 3/0644; G06F 3/0676; G06F 3/0677; G06F 3/0679
See application file for complete search history.

(56) References Cited

U.S. PATENT DOCUMENTS

| | | | | |
|---|---|---|---|---|
| 10,872,350 | B1 * | 12/2020 | Hu | G06Q 30/0256 |
| 2007/0244908 | A1 * | 10/2007 | Rajan | G06F 3/0635 |
| 2013/0067148 | A1 * | 3/2013 | Takagi | G06F 3/0659 |
| | | | | 711/E12.008 |
| 2015/0356044 | A1 | 12/2015 | Frost et al. | |
| 2016/0034218 | A1 | 2/2016 | Frost et al. | |
| 2016/0054953 | A1 * | 2/2016 | Lee | G06F 3/0664 |
| | | | | 710/74 |
| 2017/0242624 | A1 | 8/2017 | Patel et al. | |
| 2017/0249274 | A1 | 8/2017 | Trout et al. | |
| 2018/0081557 | A1 | 3/2018 | Kasibhatla et al. | |
| 2019/0332290 | A1 * | 10/2019 | Meeker | G06F 3/0656 |
| 2020/0364165 | A1 * | 11/2020 | Chang | G06F 12/0284 |
| 2020/0403909 | A1 * | 12/2020 | Kleyman | G06F 13/1668 |

FOREIGN PATENT DOCUMENTS

KR 1020180032259 A 3/2018

* cited by examiner

*Primary Examiner* — Nanci N Wong
(74) *Attorney, Agent, or Firm* — Volpe Koenig

(57) ABSTRACT

A technique for operating a memory system is disclosed. The technique includes performing a first request, by a first memory client, to access data at a first memory address, wherein the first memory address refers to data in a first memory section that is coupled to the first memory client via a direct memory connection; servicing the first request via the direct memory connection; performing a second request, by the first client, to access data at a second memory address, wherein the second memory address refers to data in a second memory section that is coupled to the first client via a cross connection; and servicing the second request via the cross connection.

20 Claims, 5 Drawing Sheets

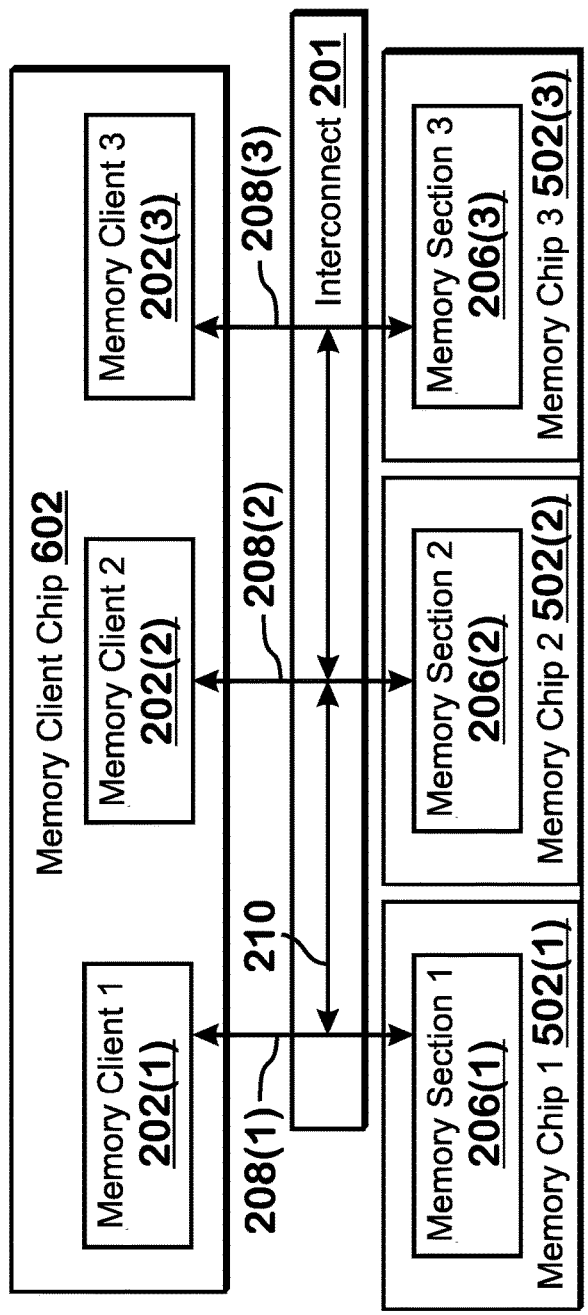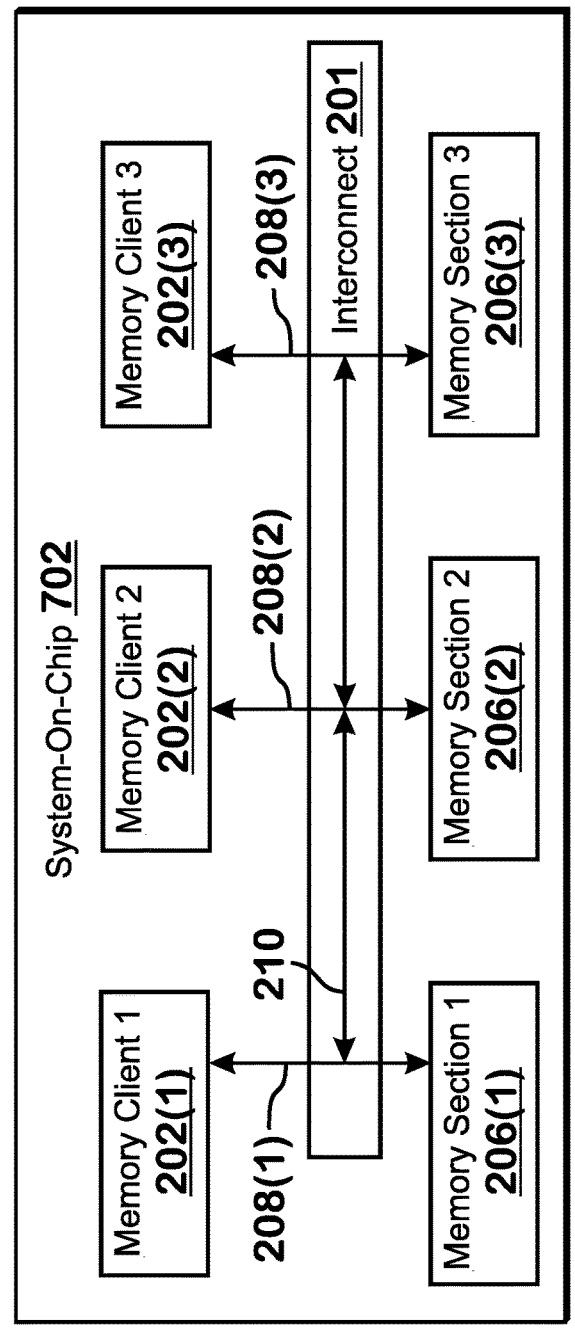
FIG. 6
FIG. 7

FLEXIBLE MEMORY SYSTEM

BACKGROUND

Memory performance is a critical aspect of computing. Thus, computer memories are constantly being improved.

BRIEF DESCRIPTION OF THE DRAWINGS

A more detailed understanding may be had from the following description, given by way of example in conjunction with the accompanying drawings wherein:

FIG. 6 illustrates a configuration in which all memory clients are on a single memory client chip and in which each memory section is on a separate memory chip;

FIG. 7 illustrates a configuration in which all memory clients and all memory sections, and the interconnect, are included within a single system-on-chip.

DETAILED DESCRIPTION

A technique for operating a memory system is disclosed. The technique includes performing a first request, by a first memory client, to access data at a first memory address, wherein the first memory address refers to data in a first memory section that is coupled to the first memory client via a direct memory connection; servicing the first request via the direct memory connection; performing a second request, by the first client, to access data at a second memory address, wherein the second memory address refers to data in a second memory section that is coupled to the first client via a cross connection; and servicing the second request via the cross connection.

Figure 1:
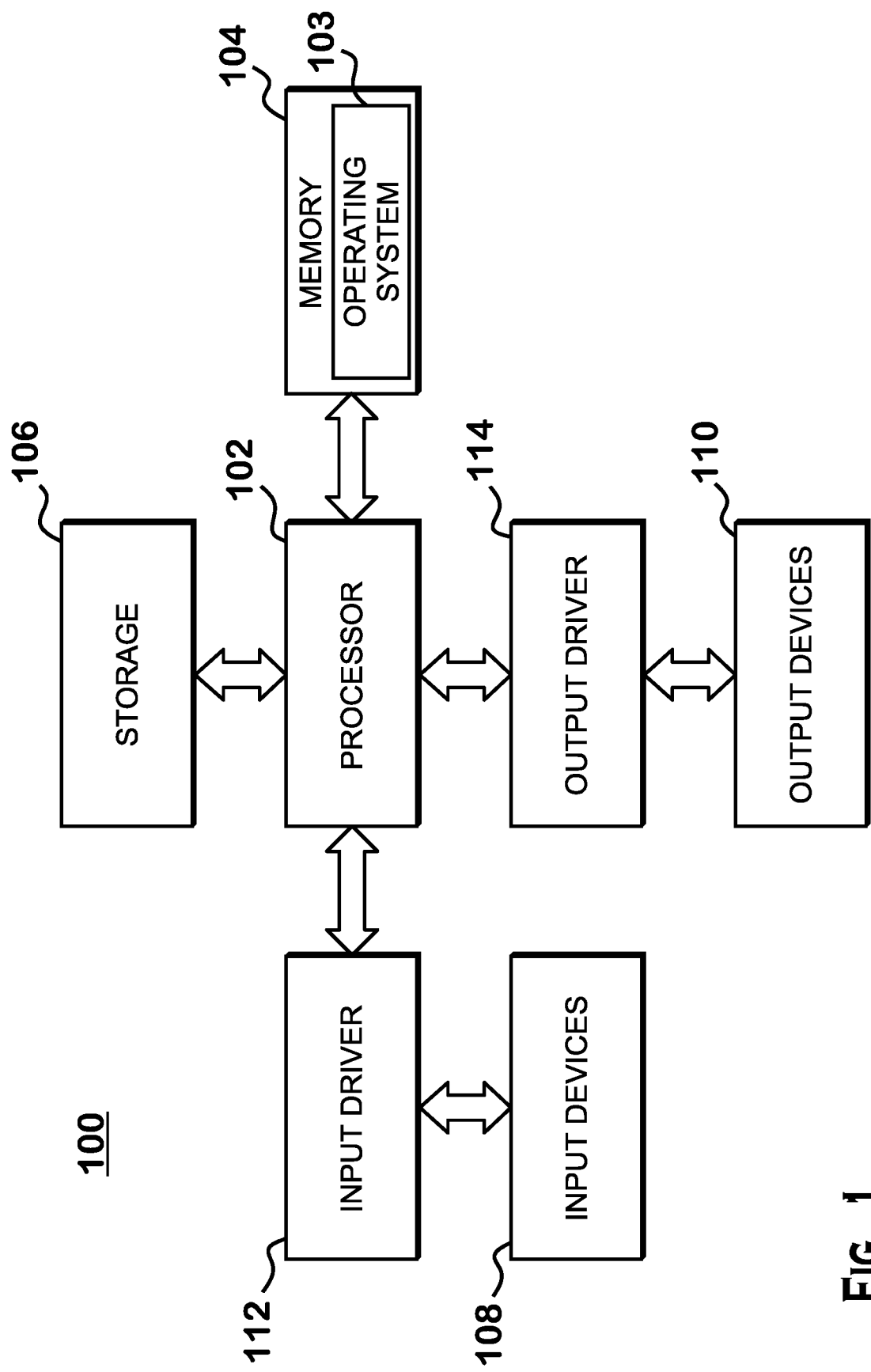
FIG. 1 is a block diagram of an example device in which one or more disclosed aspects may be implemented.

FIG. 1 is a block diagram of an example device 100 in which aspects of the present disclosure are implemented. The device 100 includes, for example, a computer, a gaming device, a handheld device, a set-top box, a television, a mobile phone, or a tablet computer. The device 100 includes a processor 102, a memory 104, a storage device 106, one or more input devices 108, and one or more output devices 110. The device 100 may also optionally include an input driver 112 and an output driver 114. It is understood that the device 100 may include additional components not shown in FIG. 1.

The processor 102 includes a central processing unit (CPU), a graphics processing unit (GPU), a CPU and GPU located on the same die, or one or more processor cores, wherein each processor core is a CPU or a GPU. The memory 104 may be located on the same die as the processor 102, or may be located separately from the processor 102. The memory 104 includes a volatile or non-volatile memory, for example, random access memory (RAM), dynamic RAM, or a cache.

The storage device 106 includes a fixed or removable storage, for example, a hard disk drive, a solid state drive, an optical disk, or a flash drive. The input devices 108 include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

In some implementations, the processor 102 executes an operating system 103 that provides a variety of functions such as software loading and execution, interfacing with the hardware, memory management, and many other functions. In some examples, memory management includes memory allocation, which includes reserving a portion of the memory 104 (or another memory) for an entity such as software or hardware that requests memory.

Figure 2:
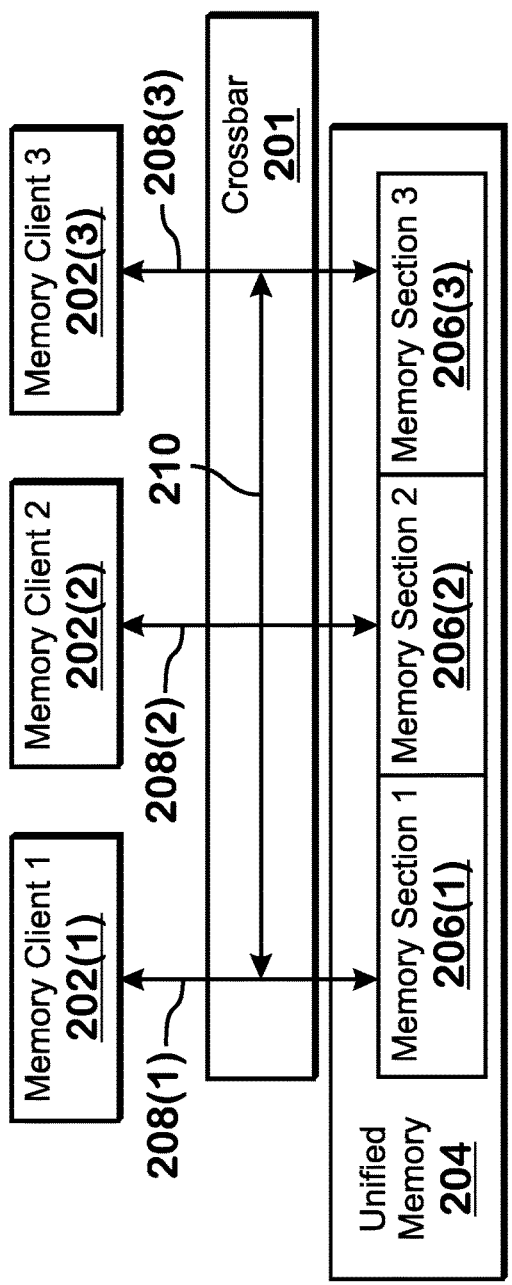
FIG. 2 illustrates a memory system, according to an example.

FIG. 2 illustrates a memory system 200, according to an example. The memory system includes memory clients 202 and a unified memory 204. Each memory client 202 is coupled to a corresponding memory section 206 via a corresponding direct memory connection 208. Each direct memory connection 208 is coupled to each other direct memory connection 208 via a cross connection 210.

Each memory client 202 is a processing unit that performs a specific type of task. Some example memory clients 202 include a central processing unit, a graphics processing unit, an input and/or output processor, a multimedia processor, or any other type of processing component that makes use of access to memory. In some examples, the unified memory 204 is or is a portion of system memory (e.g., memory 104). In some examples, one, some, or all of the memory clients 202 are part of the processor 102. In some examples, two different memory sections 206 have different performance characteristics. Some example performance characteristics include capacity, latency, bandwidth, power, and cost. Regarding capacity, it is possible for two or more memory sections 206 to have different capacities—that is, to store a different number of bytes. Regarding latency, it is possible for two or more memory sections 206 to have different latencies, meaning that such different memory sections 206 respond to access requests (e.g., reads or writes) in different amounts of time. Regarding bandwidth, it is possible for two or more memory sections 206 to have different bandwidth, where bandwidth means the amount of data those memory sections 206 can store or read per unit of time. Regarding cost, it is possible for two or more different memory sections 206 to be made with memory technologies that have different costs, which, in some cases, refers to the amount of money required to manufacture each unit of storage (e.g., each gigabyte or megabyte).

The performance characteristics for each memory section 206 are tailored for operation with an associated memory client 202. In one example, one memory client 202 (such as a video processor) functions better with a higher bandwidth and another memory client 202 (such as a central processing unit) functions better with a lower latency.

The memory clients 202 each have a direct memory connection 208 to the associated memory section 206. The direct memory connection 208 provide high bandwidth and/or low latency connection between an associated memory client 202 and an associated memory section 206. The low latency and/or high bandwidth of the direct memory connection 208 are in comparison to that provided by the cross connection 210. In other words, memory clients 202 are able to access any memory section 206, either via the direct memory connection 208 alone, or via the cross connection 210, alone or in combination with at least a portion of the direct memory connection 208. Thus the memory clients 202 are able to access the associated memory section 206 with high performance, and all memory clients 202 are able to access all memory sections 206 with somewhat less high performance. The direct connections 208 and cross connections 210 together form an interconnect 201.

It should be understood that the memory sections 206 are part of a unified memory 204. The unified memory 204 has a single contiguous physical address space. More specifically, each memory section 206 has data elements corresponding to a set of addresses. The full set of addresses for all of the memory sections 206 forms a contiguous physical memory address space. In an example, each memory section 206 is associated with a specific range of physical memory addresses and the first physical address of any particular memory section 206 (except for the first one) is directly subsequent to the last physical address of a previous memory section 206. Thus the unified memory 204 forms a single physical memory address space with differing sections having different performance characteristics, each considered "dedicated" for or "associated" with a particular memory client 202.

It is possible for any memory section 206 to be on the same physical chip as any other memory section 206. It is also possible for at least one memory section 206 to be on a different physical chip as any other memory section 206. In some examples, all of the memory sections 206 are within a single chip. In other examples, some (more than one) memory sections 206 are on one physical chip and another (one or more than one) memory sections 206 are on another physical chip. In yet other examples, all of the memory sections 206 are on their own physical chip.

In addition, it is possible for the unified memory 204 to be included on the same physical chip as one or more of the memory clients 202 and a portion or all of the interconnect 201. In one example, all of the memory clients 202, the interconnect 201, and the unified memory 204 are on the same physical chip. In another example, memory clients 202 share a chip with the direct connection 208 coupled to that memory client 202 and with the memory section 206 coupled to that direct connection. In such an example, each combination of memory client 202 and memory section 206 is on a chip, and these chips are coupled together with the cross connections 210.

As described above, a memory client 202 is able to access an associated memory section 206 via a direct connection 208 and to access other memory sections 206 via the cross connection 210. Thus, when a memory client 202 performs a read access to read requested data from an address that is within the memory section 206 associated with that memory client 202, that memory section 206 provides the requested data to the memory client 202 via the direct connection 208. When a memory client 202 performs a write access to write data to an address that is within a memory section 206 associated with the memory client 202, the memory client 202 transmits the data to the associated memory section 206 via a direct connection 208. When a memory client 202 performs a read access to read requested data from an address that is within a memory section 206 that is not associated with that memory client 202, the memory section 206 provides the requested data via a cross connection 210 that couples the memory section 206 to the memory client 202. When a memory client 202 performs a write access to write data to an address within a memory section 206 that is not associated with the memory client 202, the memory client 202 transmits the data through a cross connection 210 to the memory section 206, where the cross connection 210 couples the memory client 202 to the memory section 206.

A statement that a memory section 206 is associated with (or corresponds to) a memory client 202 or a memory client 202 is associated with (or corresponds to) a memory section 206 means that the memory section 206 is coupled to the memory client 202 via a direct connection 208.

FIG. 3-7 illustrate example configurations for a memory system.

Figure 3:
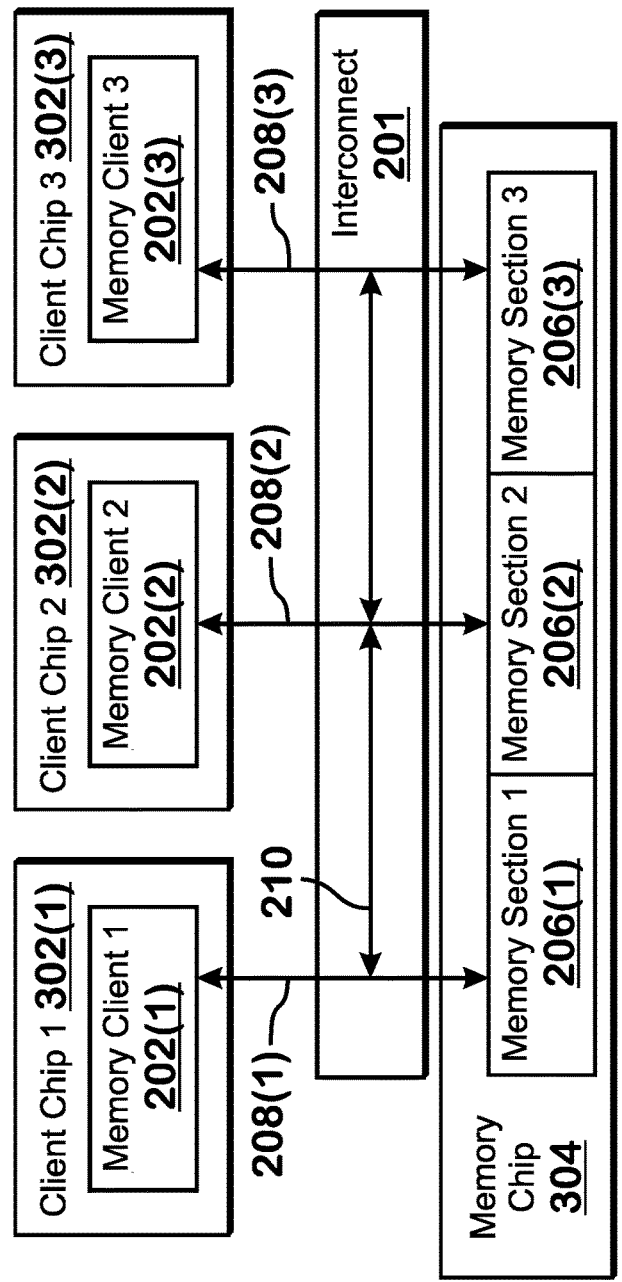
FIG. 3 illustrates an example configuration in which each memory client is on a different client chip but a single memory chip includes all of the memory sections.

FIG. 3 illustrates an example configuration in which each memory client 202 is on a different client chip 302 but a single memory chip 304 includes all of the memory sections 206. In this example, the memory sections 206 share a single physical memory chip. Each memory client 202, however, is on its own separate physical chip (client chip 302).

Figure 4:
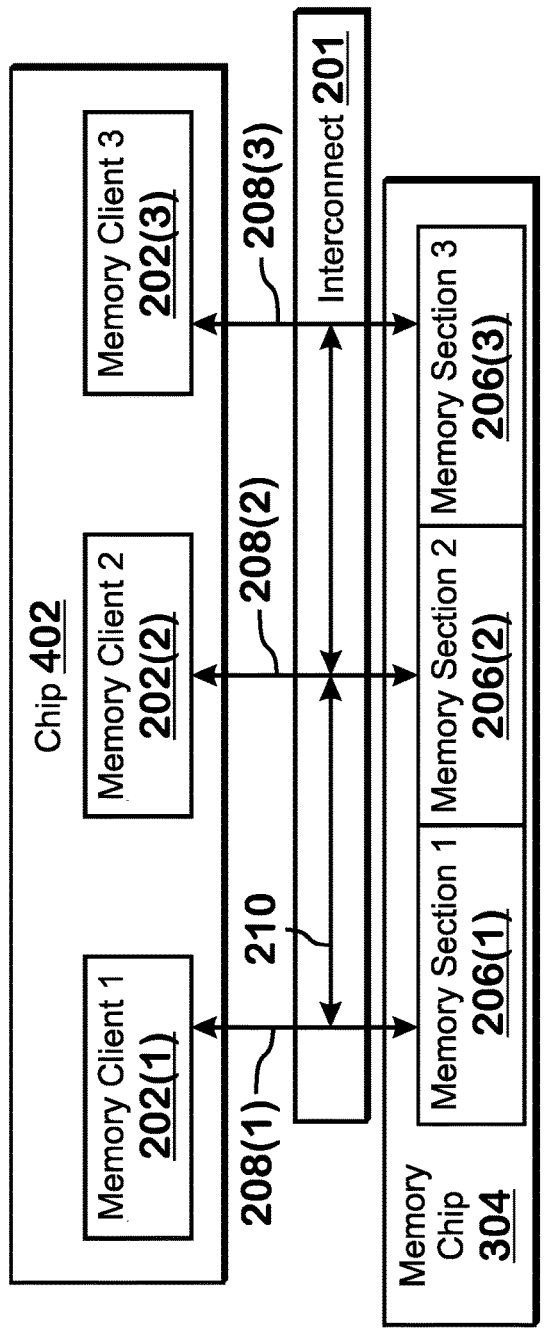
FIG. 4 illustrates an example configuration in which each memory client is located together in a single chip.

FIG. 4 illustrates an example configuration in which each memory client 202 is located together in a single chip 402. In addition, in this configuration, the memory sections 206 are also found within a single memory chip 304. The chip 402 the memory clients 202 are in is different than the chip 304 the memory sections 206 are in.

Figure 5:
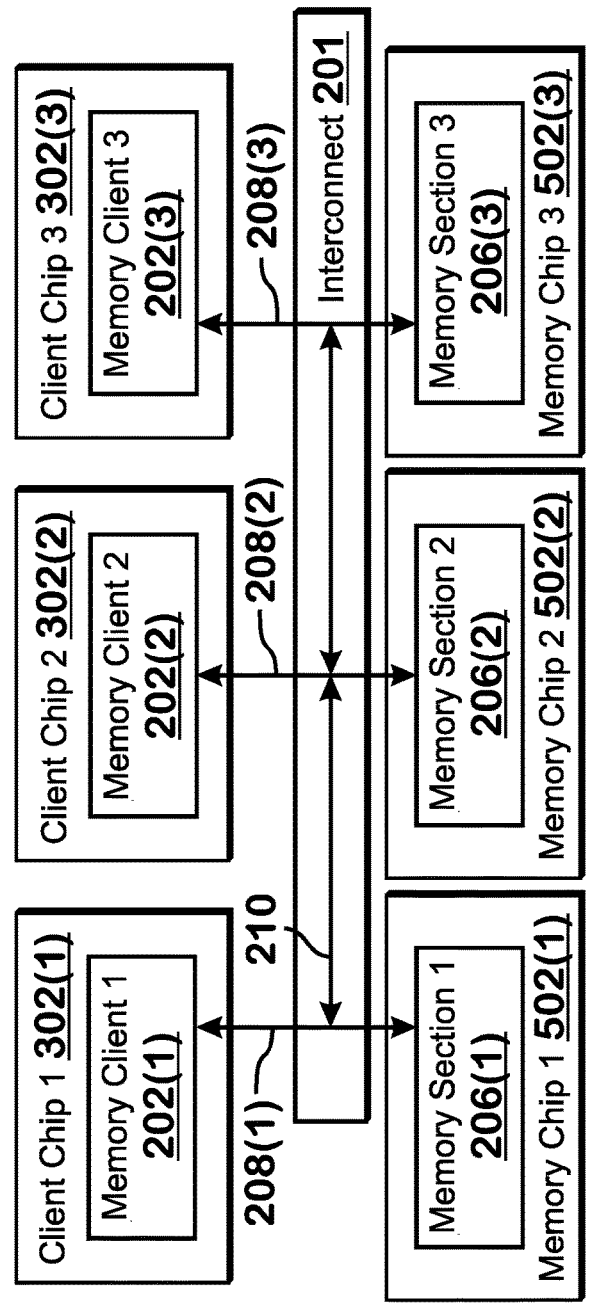
FIG. 5 illustrates a configuration in which each memory client is on its own client chip and each memory section is on its own memory chip.

FIG. 5 illustrates a configuration in which each memory client 202 is on its own client chip 302 and each memory section 206 is on its own memory chip 502. In this configuration, each of the elements illustrated is on its own physical chip. Communication occurs via connections between the chips. The interconnect 201 may be on its own chip or may consist of a combination of interconnects between the various chips.

FIG. 6 illustrates a configuration in which all memory clients 202 are on a single memory client chip 602 and in which each memory section 206 is on a separate memory chip 502. In this configuration, all of the memory clients 202 illustrated share a single physical chip, and all memory sections 206 have their own memory chip 502. The interconnect 201 may be on an independent chip, fully or partially integrated with the memory client chip 602, and/or fully or partially integrated with one or more of the memory chips 502.

FIG. 7 illustrates a configuration in which all memory clients 202 and all memory sections 206, and the interconnect 201, are included within a single system-on-chip 702. In this configuration, each illustrated element is on the same physical chip.

Above it is stated that the memory sections 206 form a contiguous physical address space. It should be understood that this physical address space is different from a virtual address space. A virtual address space is an address space in which an address translation system (which may include, for example, one or more page tables, one or more translation lookaside buffers, and/or other elements) translates virtual addresses to physical addresses. The physical addresses are the addresses used to access the memory itself. Physical addresses do not require an address translation system in order to access the underlying memory. In addition, it should be understood that the memory sections 206 are distinct parts of a physical address space. It is not required to copy data from one memory section 206 to another memory section 206 in order for the data to be accessed. The data can be accessed by a memory client 202 directly through the interconnect 201.

It is described elsewhere herein that each memory client 202 has a direct connection 210 to a memory section 206. Thus the memory clients 202 have what is considered to be "best performance" for the memory section 206 associated with that memory client 202. For this reason, in response to software executing on a particular memory client 202 requesting memory allocation from the operating system 103, the operating system 103 allocates that memory in the memory section 206 associated with that memory client 202. In an example, a software application such as a video game, which uses a graphics processing unit (one of the memory clients 202), requests memory allocation from the operating system 103 for data to be processed by the graphics processing unit. In response, the operating system 103 allocates the requested memory on the memory section 206 associated with the graphics processing unit. Thus the operating system 103 allocates memory for a memory client 202 in the memory section 206 corresponding to the memory client 202. In another example, a software application, such as a productivity application, requests memory allocation from the operating system 103. In response, the operating system 103 allocates the requested memory on the memory section 206 associated with the central processing unit. In sum, in many situations, the operating system 103 allocates memory in memory sections 206 associated with the primary memory client 202 to use the data at that memory allocation.

Note that although it has been shown that each memory client 202 has one associated memory section 206, implementations of memory systems do not have to be so limited. Specifically, it is possible for multiple memory clients 202 to have direct connections 208 to the same memory section 206 and/or for multiple memory sections 206 to have direct connections 208 to the same memory client 202.

Figure 8:
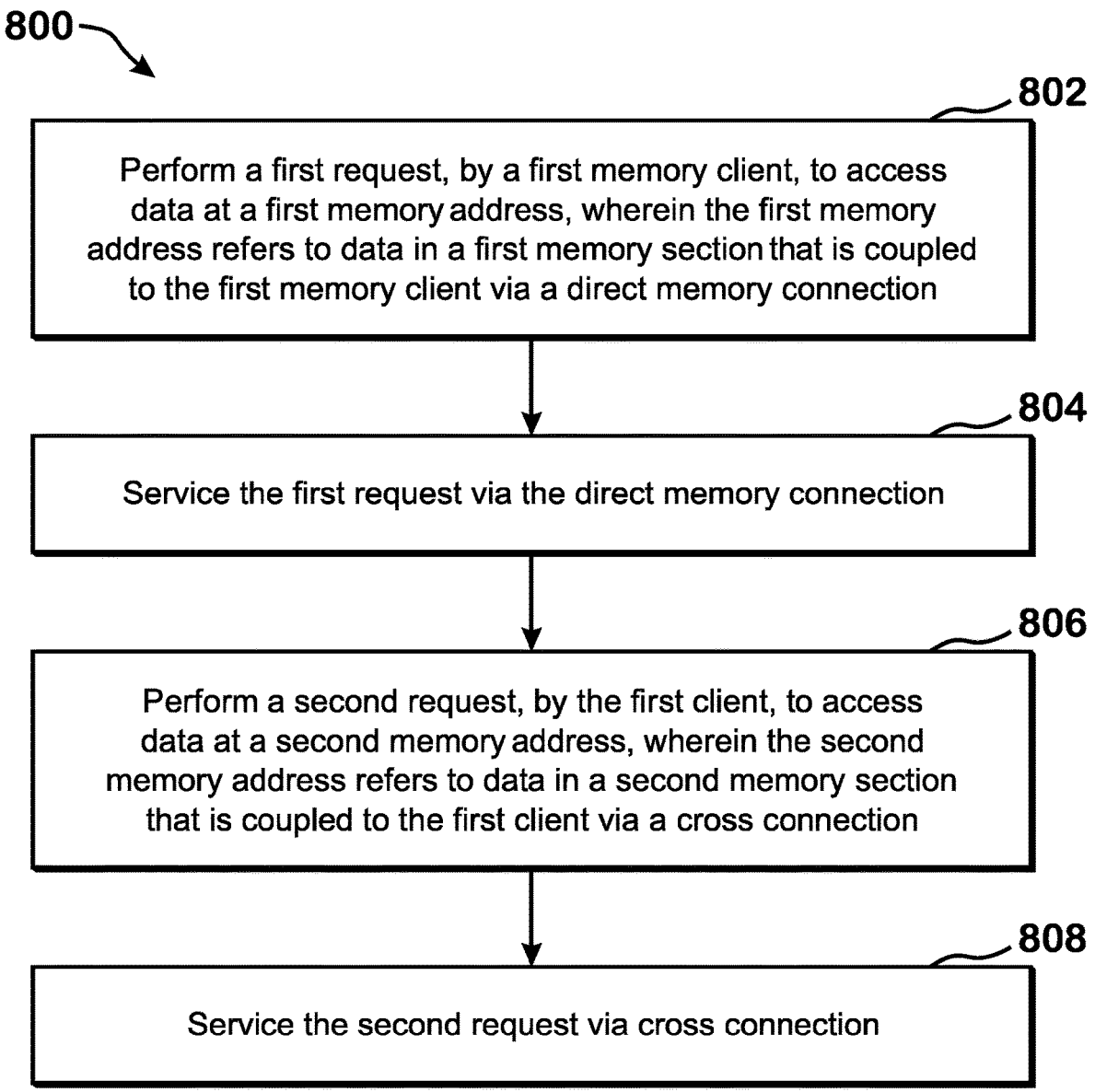
FIG. 8 is a flow diagram of a method for operating a memory system, according to an example.

FIG. 8 is a flow diagram of a method for operating a memory system, according to an example. Although described with respect to the system of FIGS. 1-7, those of skill in the art will recognize that any system, configured to perform the steps of the method 800 in any technically feasible order, falls within the scope of the present disclosure.

At step 802, a first memory client 202 performs a first request to access data at a first memory address. The first memory address refers to data in a first memory section 206. The first memory section 206 is coupled to the first memory client 202 via a direct memory connection 208. At step 804, the first memory client 202 services the first request via the direct memory connection 208.

At step 806, the first client 202 performs a second request to access data at a second memory address. The second memory address refers to data in a second memory section 206 that is coupled to the first client via a cross connection 210. At step 808, the first memory client 202 services the second request via the cross connection 210.

In some examples, the direct memory connection 208 has lower latency than the cross connection 210. In some examples, the direct memory connection 208 has higher bandwidth than the cross connection 210. In some examples, the operating system 103 allocates memory for the data at the first address in the first memory section due to the first memory section being coupled to the first memory client via the direct memory connection 208. In some examples, the operating system 103 allocates the memory for the data at the first address in the first memory section due to the data being used for software executing on the first client 202. In some examples, the operating system 103 allocates memory for the data in the second memory address in the second memory section due to the second memory section being coupled to a second memory client via a direct memory connection 208. In some examples, the operating system allocates the memory for the data at the second address in the second memory section due to the data being used for software executing on the second client 202.

Although the term "chip" is sometimes used herein, it should be understood that this word can be replaced with "package." In some cases, a package is a single physical entity but has multiple physical chips.

It should be understood that many variations are possible based on the disclosure herein. Although features and elements are described above in particular combinations, each feature or element may be used alone without the other features and elements or in various combinations with or without other features and elements.

Various elements described herein are implemented as circuitry that performs the functionality described herein, as software executing on a processor, or as a combination thereof. In FIG. 1, the processor 102 is a computer processor that performs operations described herein. The input driver 112, output driver 114, input devices 108, and output devices 110 are software executing on one or more processors, hardware, or a combination thereof. The memory clients 202, interconnects 201, and memory sections 206 are implemented as hard-wired circuits, as processors, as software executing on one or more processors, or as a combination thereof, that perform the operations described herein.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for operating a memory system, the method comprising:
performing a first request, by a first memory client among a plurality of memory clients, to access data at a first memory address, wherein each of the plurality of memory clients is a processing unit that performs a respective specific type of task;
servicing the first request by providing first data to the first memory client from a first memory section identified by the first memory address via a direct memory connection;
performing a second request, by the first memory client, to access data at a second memory address; and
servicing the second request by providing second data to the first memory client from a second memory section identified by the second memory address via a cross connection that is between the direct memory connection and a second direct memory connection that is between the second memory section and a second memory client.

2. The method of claim 1, wherein the direct memory connection has higher bandwidth than the cross connection.

3. The method of claim 1, wherein the direct memory connection has lower latency than the cross connection.

4. The method of claim 1, wherein the first memory section and the second memory section form part of a physical address space.

5. The method of claim 1, further comprising allocating the first data to the first memory section in response to a request by the first memory client.

6. The method of claim 1, further comprising allocating the second data to the second memory section in response to a request by a second memory client that is different than the first memory client.

7. The method of claim 1, wherein the first memory section has different bandwidth characteristics than the second memory section.

8. The method of claim 1, wherein the first memory section has different latency characteristics than the second memory section.

9. The method of claim 1, wherein the first memory section has different capacity than the second memory section.

10. The method of claim 1, wherein the first memory section has different cost than the second memory section.

11. A system comprising:
a first memory section;
a second memory section;
a plurality of memory clients, wherein each of the plurality of memory clients is a processing unit that performs a respective specific type of task; and
a first memory client among the plurality of memory clients, wherein the first memory client is coupled to the first memory section via a direct memory connection and to the second memory section via a cross connection,
wherein the first memory client is configured to:
perform a first request to access data at a first memory address, wherein the first memory address refers the first memory section;
service the first request by providing first data to the first memory client from the first memory section via the direct memory connection,
perform a second request to access data at a second memory address, wherein the second memory address refers the second memory section; and
servicing the second request by providing second data to the first memory client from the second memory section via the cross connection that is between the direct memory connection and a second direct memory connection that is between the second memory section and a second memory client.

12. The system of claim 11, wherein the direct memory connection has higher bandwidth than the cross connection.

13. The system of claim 11, wherein the direct memory connection has lower latency than the cross connection.

14. The system of claim 11, wherein the first memory section and the second memory section form part of a physical address space.

15. The system of claim 11, wherein the first memory section is configured to allocate the first data to the first memory section in response to a request by the first memory client.

16. The system of claim 11, wherein the second memory section is configured to allocate the second data to the second memory section in response to a request by a second memory client that is different than the first memory client.

17. The system of claim 11, wherein the first memory section has different bandwidth characteristics than the second memory section.

18. The system of claim 11, wherein the first memory section has different latency characteristics than the second memory section.

19. The system of claim 11, wherein the first memory section has different capacity than the second memory section.

20. The system of claim 11, wherein the first memory section has different cost than the second memory section.

* * * * *